United States Patent [19]
Mezaki

[11] Patent Number: 5,469,634
[45] Date of Patent: Nov. 28, 1995

[54] DRAINING AND DRYING APPARATUS OF SEMICONDUCTOR MATERIALS

[75] Inventor: Tamotsu Mezaki, Chofu, Japan

[73] Assignee: Sugai Corporation, Higashi-Osaka, Japan

[21] Appl. No.: 140,523

[22] Filed: Oct. 25, 1993

[30] Foreign Application Priority Data

Oct. 26, 1992 [JP] Japan ..................... 4-287607

[51] Int. Cl.⁶ ..................................... F26B 17/32
[52] U.S. Cl. ..................... 34/58; 34/317; 34/186
[58] Field of Search .................. 34/58, 312, 317, 34/318, 186, 187

[56] References Cited

U.S. PATENT DOCUMENTS

| | | | |
|---|---|---|---|
| 4,677,759 | 7/1987 | Inamura | 34/58 |
| 4,777,732 | 10/1988 | Hirano | 34/58 |
| 4,907,349 | 3/1990 | Aigo | 34/58 |
| 4,987,687 | 1/1991 | Sugimoto | 34/58 |

FOREIGN PATENT DOCUMENTS 5-226316  9/1993  Japan .
5-283392  10/1993  Japan .

Primary Examiner—Denise L. Gromada
Attorney, Agent, or Firm—Popham, Haik, Schnobrich & Kaufman, Ltd.

[57] ABSTRACT

A draining and drying apparatus of semiconductor materials capable of adjusting the rotation balance of a rotor for holding the semiconductor materials without requiring any filling works of dummy semiconductor materials. In a rotary casing, a rotor horizontal moving mechanism is mounted on a rotation main shaft of a rotor, and the rotor is mounted on this rotor horizontal moving mechanism, and the rotor is mechanically moved horizontally in the intersecting direction to the rotation main shaft by the rotor horizontal moving mechanism, so that the rotation balance of the rotor may be adjusted.

10 Claims, 6 Drawing Sheets

5,469,634

DRAINING AND DRYING APPARATUS OF SEMICONDUCTOR MATERIALS

BACKGROUND OF THE INVENTION

1. Field of the Invention

The present invention relates to a draining and drying apparatus of semiconductor material, and more particularly to the art of drying semiconductor materials such as semiconductor silicon wafers and glass photo masks. Water drops (draining) of cleaning solution existing on the semiconductor materials are removed using the centrifugal force action of a so-called spindle dryer after the semiconductor materials are treated in a series of processes including an etching process, a resist peeling process, etc. and related cleaning processes.

2. Description of the Related Art

Generally, in wet treating process of semiconductor materials, generally, semiconductor materials are grouped together by a specific number of pieces, and sequentially treated in a series of treating processes including etching process, resist peeling process, etc. and related cleaning processes, and finally drained and dried.

That is, a cassette (also known as carrier) accommodating a specific number of semiconductor materials is sequentially conveyed in a series of treating process steps comprising etching step, resist peeling step, etc. and related cleaning steps, and is finally conveyed to the drying step to be dried by the draining and drying apparatus.

Hitherto, various structures have been known for such draining and drying apparatus. A general structure of these apparatuses is to make use of the centrifugal force action of a spin dryer, and comprises a rotor driven at high rotating speed, a rotor casing enclosing the rotor, and a pair of cradles disposed on the rotor oppositely across the center of rotation for accommodating a specific number of semiconductor materials to be dried.

Two cassettes are set in the cradles on the rotor, and the rotor rotates at high speed, and the semiconductor materials in the cassette accommodated in the cradles are turned about the center of rotation of the rotor, and water drops of cleaning solution existing on the semiconductor materials are removed by the centrifugal force generated at this time, thereby draining and drying.

The cassettes containing a specific number of semiconductor materials are automatically conveyed by a conveying device (a onveying robot) in a series of treating steps including etching step, resist peeling step, etc. and related cleaning steps, and finally in the draining and drying step, and the number of semiconductor materials contained in the cassettes are automatically counted by the conveying device, and the result of counting is sequentially sent and processed in a central control part provided in each step, that is, the central processing unit.

Recently, however, the manner of use of the draining and drying apparatus varies depending on the users, and the conventional structure involves the following problems, of which improvements have been demanded.

That is, although two cradles for receiving the cassettes are disposed on the rotor of the apparatus, various manners of use existed, for example, (1) only one cradle accommodated a cassette containing a specific number of semiconductor materials, or (2) a cassette containing a specific number of semiconductors was put in one cradle, while a cassette containing less than a specific number of semiconductor materials was put in the other cradle.

In such case, therefore, it is necessary to adjust the balance of rotation of the rotor. In the former case, for instance, a cassette containing a specific number of dummy semiconductor materials must be put in the other cradle, or in the latter case, the cassette containing less than a specific number of semiconductor materials must be filled with dummy semiconductor materials for cover up for the shortage. All these filling works must be done manually, which not only lowers the processing efficiency in the drying process, but also brings about various problems in the flow of a series of processes.

SUMMARY OF THE INVENTION

It is hence a primary object of the invention to present a novel draining and drying apparatus of semiconductor materials solving the problems of the related art.

It is other object of the invention to present a draining and drying apparatus of semiconductor materials capable of adjusting the rotation balance of the rotor without requiring any filling work of dummy semiconductor materials.

It is a different object of the invention to present a draining and drying apparatus of semiconductor materials free from lowering of processing efficiency in the drying process, and free from troubles in the flow in a series of treating steps comprising etching step, resist peeling step, and related cleaning steps as the pretreatment.

It is a further different object of the invention to present a draining and drying apparatus of semiconductor materials capable of greatly saving the labor of workers and alleviating fatigue of workers.

In the constitution of the draining and drying apparatus of semiconductor materials of the invention, a rotor is disposed in a rotor casing, and a pair of cradles is disposed on the rotor oppositely across the rotation main shaft of the rotor, and semiconductor materials contained in the cradles are drained and dried by high speed rotation of the rotor, in which a rotor horizontal move mechanism is incorporated in the rotation main shaft, and the rotor is mounted on this rotor horizontal move mechanism, and the rotor horizontal move mechanism comprises a rotation base affixed and supported at the upper end of the rotation main shaft, a rotor mounting part disposed on the rotation base so as to be movable horizontally toward the confronting directions of the two cradles, with the rotor fixed and placed thereon, and a driving unit for horizontally moving the rotor mounting part.

These and other objects and features of the invention will be better understood and appreciated in the following detailed description taken in conjunction with the accompanying drawings and the novel features indicated in the subsequent claims.

DETAILED DESCRIPTION OF THE PREFERRED EMBODIMENT

Figure 1:
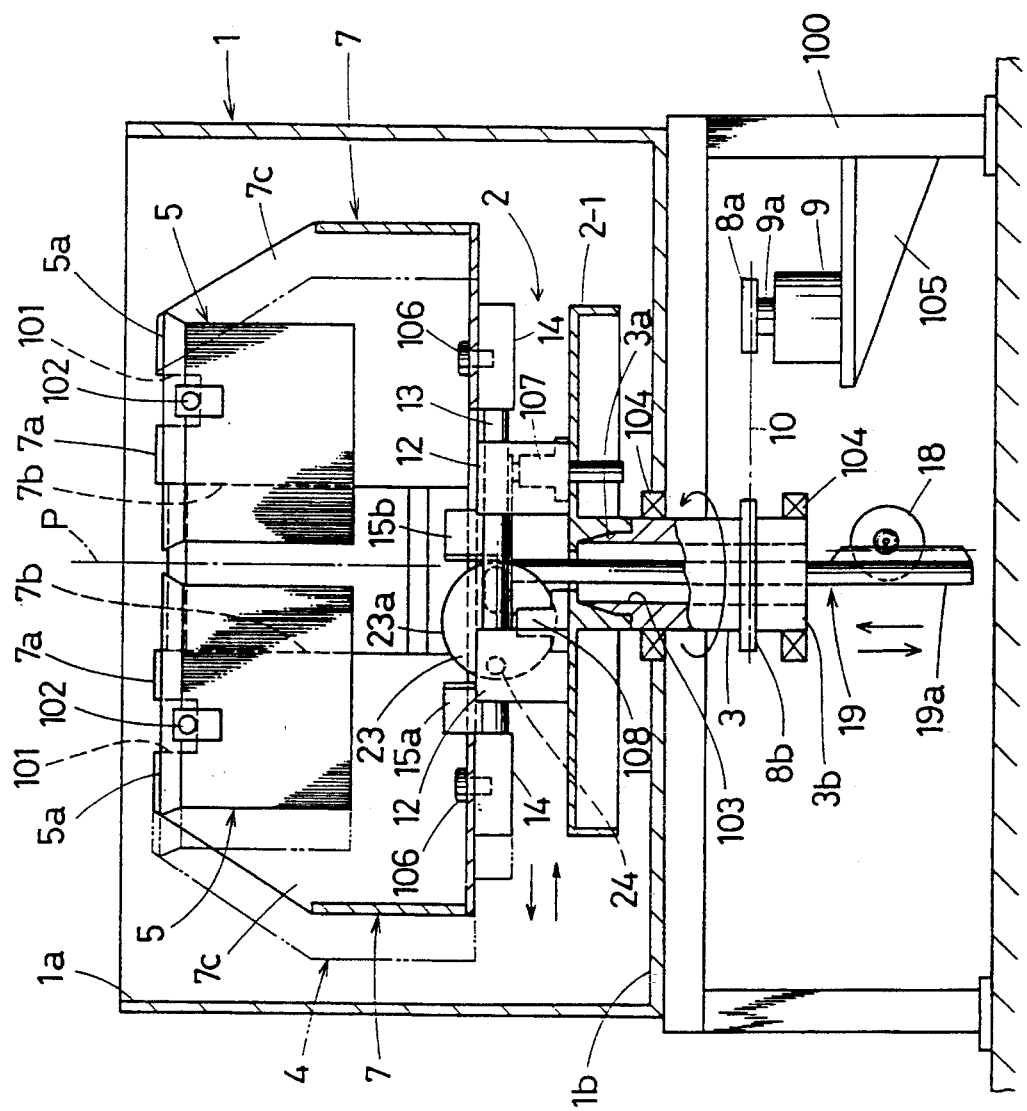
FIG. 1 is a front sectional view of an embodiment of a draining and drying apparatus of semiconductor materials of the invention.

Referring now to the drawings, a preferred embodiment of the invention is described in detail below.

FIG. 1 through FIG. 6 show the draining and drying apparatus of semiconductor materials of the invention, and same reference numbers refer to same members or elements throughout the drawings.

The illustrated draining and drying apparatus mainly comprises a rotor horizontal move mechanism 2, a rotation main shaft 3, and a rotor 4 disposed in a rotor casing 1, and it is constituted so as to drain and dry semiconductor materials A, A, . . . contained in a cassette 6 being delivered by a conveying device not shown on the drawing, by high speed rotation of the rotor 4. The cassette 6 is formed in a size and structure capable of containing a specific number of, for example, about twenty-five semiconductor materials A, A, . . . assembled parallel in one direction.

The rotor casing 1 is formed in a cylindrical form opened in its upper part as shown in FIG. 1, and is disposed on a base frame 100. An upper opening 1a of the rotor casing 1 is an access for semiconductor materials A in a flat disk form, and is opened and closed by a lid not shown in the drawing.

The rotor horizontal move mechanism 2 is mounted on the rotation main shaft 3 in the rotor casing 1, and the rotor 4 is mounted on its rotor mounting part 2-2. A pair of cradles 5, 5 are disposed on the rotor 4, oppositely across the center of the rotor 4, and the cassette 6 is put in one or both of the two cradles.

The cradle 5 has a known shape and size enough to accommodate the cassette 6 of the specified shape and size, and in the illustrated example it is formed in a box form with substantially a rectangular shape in a plan view, opened in its upper part 5a. This cradle 5 is mounted and supported by a pair of support frames 7, 7 composing the rotor 4 so as to be tiltable vertically.

The both support frames 7, 7 are in an approximately flat pi-shape opened in its upper part 7a and mutually confronting side parts 7b, and disposed oppositely to each other across the center of the rotor 4. In both side walls 7c, 7c of each support frame 7, shaft support parts 101 are individually provided, and support shafts 102, 102 of the cradles 5 are supported on these shaft support parts 101, 101, and the cradles 5 are suspended and supported so as to be tiltable vertically.

The rotation main shaft 3 is a hollow shaft having a vertical penetration hole 103 in the center thereof, and is rotatably mounted in vertical state through bearings 104, 104 in the central part of the bottom part 1b of the rotor casing 1. The upper end part 3a of the rotation main shaft 3 penetrates and projects to confront the inside of the rotor casing 1, and the rotor horizontal move mechanism 2 is integrally installed hereon. The lower end part 3b of the rotation main shaft 3 is linked to a driving motor 9 which is the driving means of rotation.

This driving motor 9 is mounted on the base frame 100 upward through a mounting bracket 105, and a driving member 8a such as a sprocket wheel or pulley attached to the drive shaft 9a is linked to a driven member 8b such as a sprocket wheel or pulley attached to the lower end part 3b of the rotation main shaft 3 through a power transmission member 10 such as a chain or belt. By rotation of the driving motor 9, the rotation main shaft 3 is put in rotation through the power transmission means 8a, 10, 8b, and the rotor 4 is rotated at high speed together with the rotor horizontal move mechanism 2.

Figure 2:
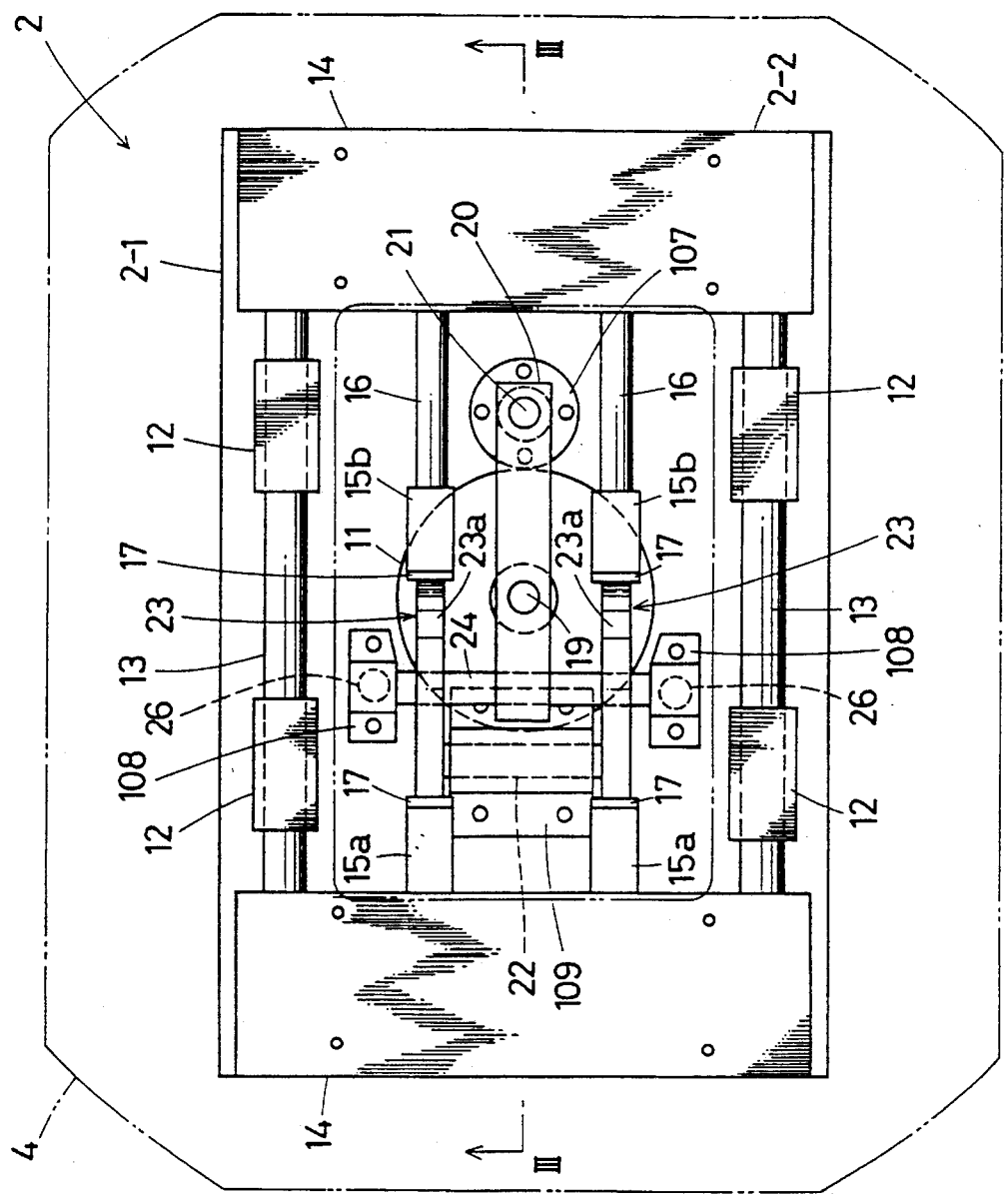
FIG. 2 is a plan view showing a rotor horizontal move mechanism of the draining and drying apparatus.
Figure 3:
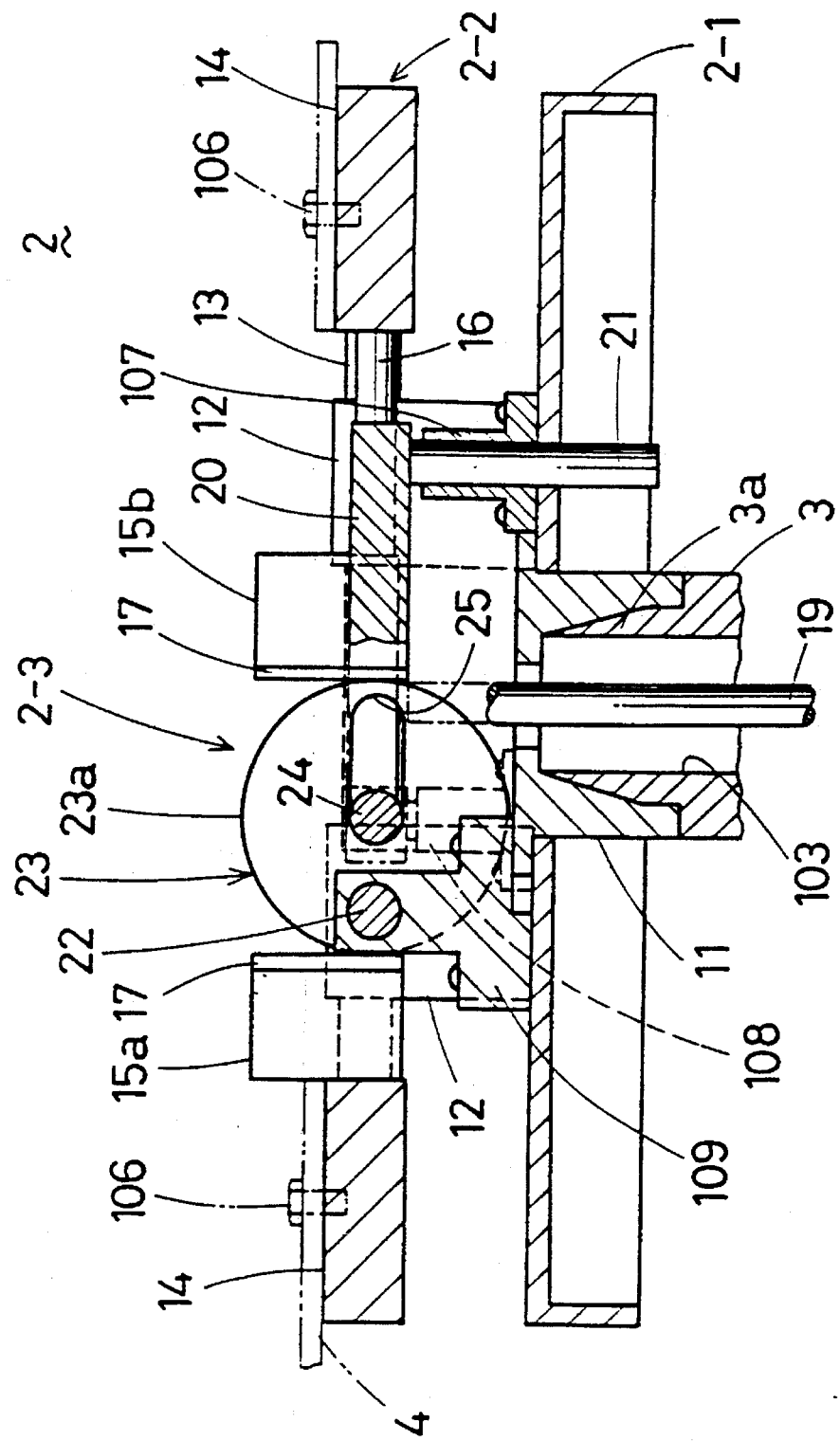
FIG. 3 is a sectional view of the rotor horizontal move mechanism shown along line III—III in FIG. 2, disclosing the state in which the rotor mounting part is in neutral position.
Figure 4:
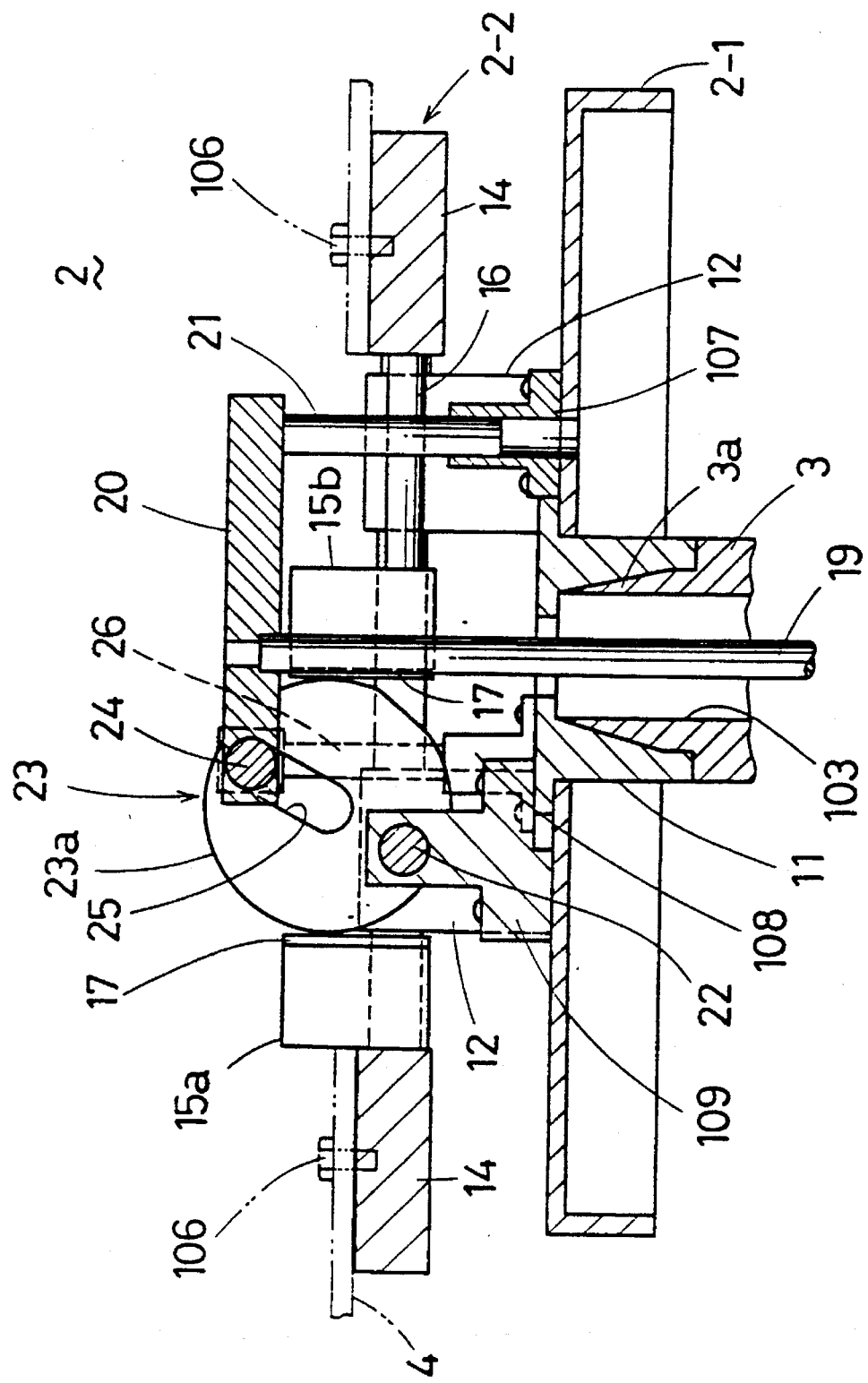
FIG. 4 is a sectional view of the rotor horizontal move mechanism shown along line III—III in FIG. 2, disclosing the state in which the rotor mounting part is in maximum eccentric position by horizontal move.

The rotor horizontal move mechanism 2 is to adjust the rotation balance of the rotor 4 by dislocating the rotor 4 in the horizontal direction depending on the filling state of the semiconductor materials A, A, . . . in the cradles 5, 5, and comprises rotation base 2-1, rotor mounting part 2-2, and driving part 2-3 as shown in FIGS. 2 to 4.

The rotation base 2-1 is formed approximately in a rectangular form in a plan view same as the rotor 4, and a mounting member 11 integrally provided in its central part is fitted and fixed to the upper end part 3a of the rotation main shaft 3 from the upper side, so that the rotation base 2-1 is mounted horizontally on the rotation main shaft 3 in the rotor casing 1.

The rotor mounting part 2-2 is for moving the rotor 4 in the horizontal direction, and, as shown in FIG. 2, a pair of guide shafts 13, 13, and a pair of rotor mounting plates 14, 14 are assembled and formed in an approximately rectangular form as seen on the plane in about the same size as the rotation base 2-1.

The both guide shafts 13, 13 are set parallel to each other, and each guide shaft 13 is supported by slidably penetrating into a pair of guide blocks 12 disposed on the rotation base 2-1. Hence, the rotor mounting part 2-2 is movable on the rotation base 2-1 horizontally in the direction of its longer side (in the lateral direction in FIG. 2).

On the both rotor mounting plates 14, 14, the rotor 4 is mounted and fixed. In this case, the rotor 4 is tightened and fixed on both rotor mounting plates 14, 14 through mounting bolts 106, 106 in the state of being positioned by using positioning pins or the like, so that the both cradles 5, 5 may be oppositely disposed at both sides in the longitudinal direction (the side of the both rotor mounting plates 14, 14) of the rotation base 2-1.

As a result, on the rotation base 2-1, the rotor 4 is movable horizontally in the direction of one diameter about the axial center position P of the rotation main shaft 3 as seen on the plane, that is, in the confronting directions of the both cradles 5, 5.

In the drawing, numerals 15a, 15b denote cam abutting parts disposed oppositely to each other on the confronting sides of the both rotor mounting plates 14, 14. These cam abutting parts 15a, 15b, . . . are to cooperate with an eccentric cam 23 of tile driving part 2-3 mentioned later, and a synthetic resin plate 17 of high lubricity is disposed on each contact surface.

The cam abutting parts 15a, 15a on the side of one rotor mounting plate 14 are directly affixed to the confronting surface of the rotor mounting plate 14. The cam abutting parts 15b, 15b on the side of the other rotor mounting plate 14 are attached to the confronting side of the rotor mounting plate 14 through support shafts 16, 16 disposed parallel to the guide shaft 13.

The confronting cam abutting parts 15a, 15b are both disposed on a line between and parallel to the guide shafts 13, 13, and are arranged so as to confront each other across a clearance of the diameter of the eccentric cam 23. Accordingly, the both cam abutting parts 15a, 15b are always in contact with the outer circumference of the eccentric cam 23, that is, the cam surface 23a, and therefore, along with the rotation of the eccentric cam 23 as mentioned later, the rotor mounting part 202 or the rotor 4 is moved in the longitudinal direction of the rotation base 2-1.

The driving part 2-3 is to induce an action to move the rotor mounting part 202 horizontally in the longitudinal direction of the rotation base 2-1, and it comprises the eccentric cam 23 and cam driving mechanisms (cam driving means) 18 to 20.

In the penetration hole 103 of the rotation main shaft 3, a vertical shaft 19 is inserted so as to be movable vertically. The lower end part 19a of this vertical shaft 19 is linked to a driver means 18 such as servo motor or pulse motor through a power transmission mechanism such as rack and pinion as shown in FIG. 1. At the upper end of the vertical shaft 19, a cam operating lever 20 is attached perpendicularly, that is, in a horizontal state parallel to the both guide shafts 13, 13 of the rotor mounting part 2-2.

At one end part of the cam operating lever 20, a guide rod 21 is attached perpendicularly, that is, vertically, and this guide rod 21 is inserted and supported so as to be slidable in the vertical direction in a guide block 107 of the rotation base 2-1, and the cam operating lever 20 is elevated and guided in the vertical direction while keeping the horizontal state.

At the other end of the cam operating lever 20, a cam driving shaft 24 to be engaged with an eccentric cam 23 is provided. This cam starting shaft 24 installed in horizontal state so as to be perpendicular to the cam operating lever 20, and penetrates through slots 25, 25 of the eccentric cams 23, 23 disposed at both sides of the cam operating lever 20, and the eccentric cams 23, 23 are linked to the vertical shaft 19 so as to be capable of driving the cams. Incidentally, at both ends of the cam driving shaft 24, a guide rod 26 is individually installed vertically, and these guide rods 26, 26 are inserted and supported in the guide blocks 108, 108 of the rotation base 2-1 so as to be slidable in the vertical direction, and the cam driving shaft 24 is elevated and guided in the vertical direction, together with the cam operating lever 20 while keeping the horizontal state.

The pair of eccentric cams 23, 23 are disposed at both sides of the cam operating lever 20 so as to be rotatable eccentrically.

That is, the cam shaft 22 is rotatably pivoted in horizontal sate on a bearing block 109 of the rotation base 2-1, and the position eccentric from the center of the both eccentric cams 23, 23 is mounted and fixed at both ends of the cam shaft 22, and the both eccentric cams 23, 23 are eccentrically rotatable about the cam shaft 22.

As mentioned above, on the cam surface 23a of each eccentric cam 23, a pair of cam abutting parts 15a, 15b are slidably abutted.

Hence, by rotation of the driver means 18, when the vertical shaft 19 is moved vertically, the eccentric cams 23, 23 are operated through the cam driving mechanisms 19, 20, and the rotor mounting part 2-2 moves reciprocally in the horizontal direction. In this case, the moving stroke of the rotor mounting part 2-2 is defined by the vertical motion stroke of the vertical shaft 19, and the opening range of a slot 25 in the eccentric cam 23.

Figure 5:
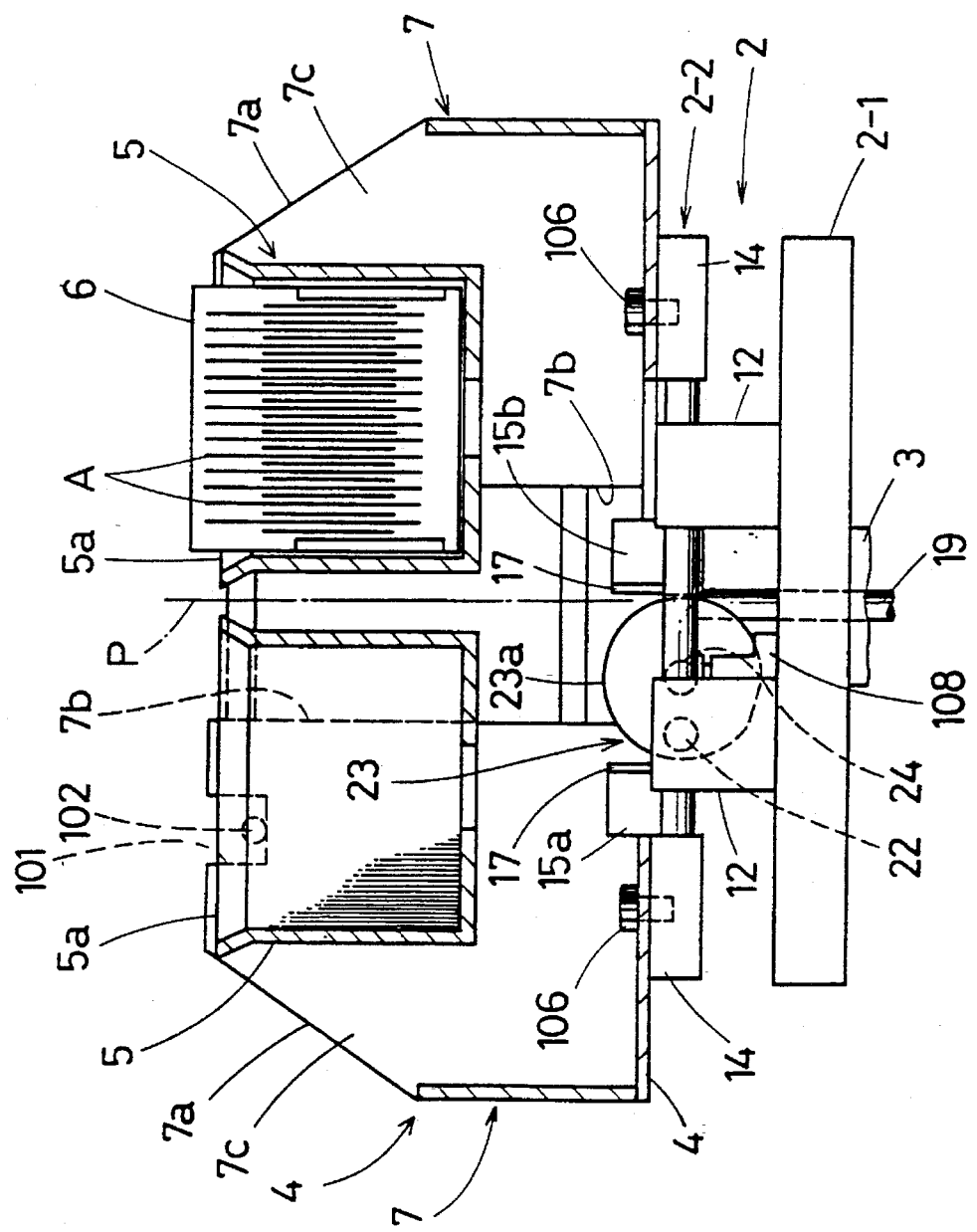
FIG. 5 is a front sectional view showing essential parts of the draining and drying apparatus, in which the rotor mounting part is in the state of neutral position in FIG. 3.

In the illustrated example, as shown in FIG. 3, when the vertical shaft 19 is lowered and in the lowest position, the rotor mounting part 2-2 is in neutral position, that is, the center of the rotor 4 is in the position coinciding with the axial center position P of the rotation main shaft 3 as seen on the plane (see FIG. 5). Besides, as shown in FIG. 4, when the vertical shaft 19 elevates to the highest position, the rotor mounting part 2-2 is in the maximum eccentric position, that is, the position in which the center of the rotor 4 is most deviated in the horizontal lateral direction from the axial center position P of the rotation main shaft 3 as seen on the plane (see FIG. 6). The rotor mounting part 2-2 on which the rotor 4 is mounted and fixed moves between the neutral position and the maximum eccentric position, and may stand at the best position depending on the weight balance of the cradles 5, 5 on the rotor 4.

In the wet processing apparatus of semiconductor materials having thus composed draining and drying apparatus disposed in the final drying process, a program according to the conditions of use of the draining and drying apparatus is predetermined in the control device for automatically controlling the conveying device, etc.

Figure 6:
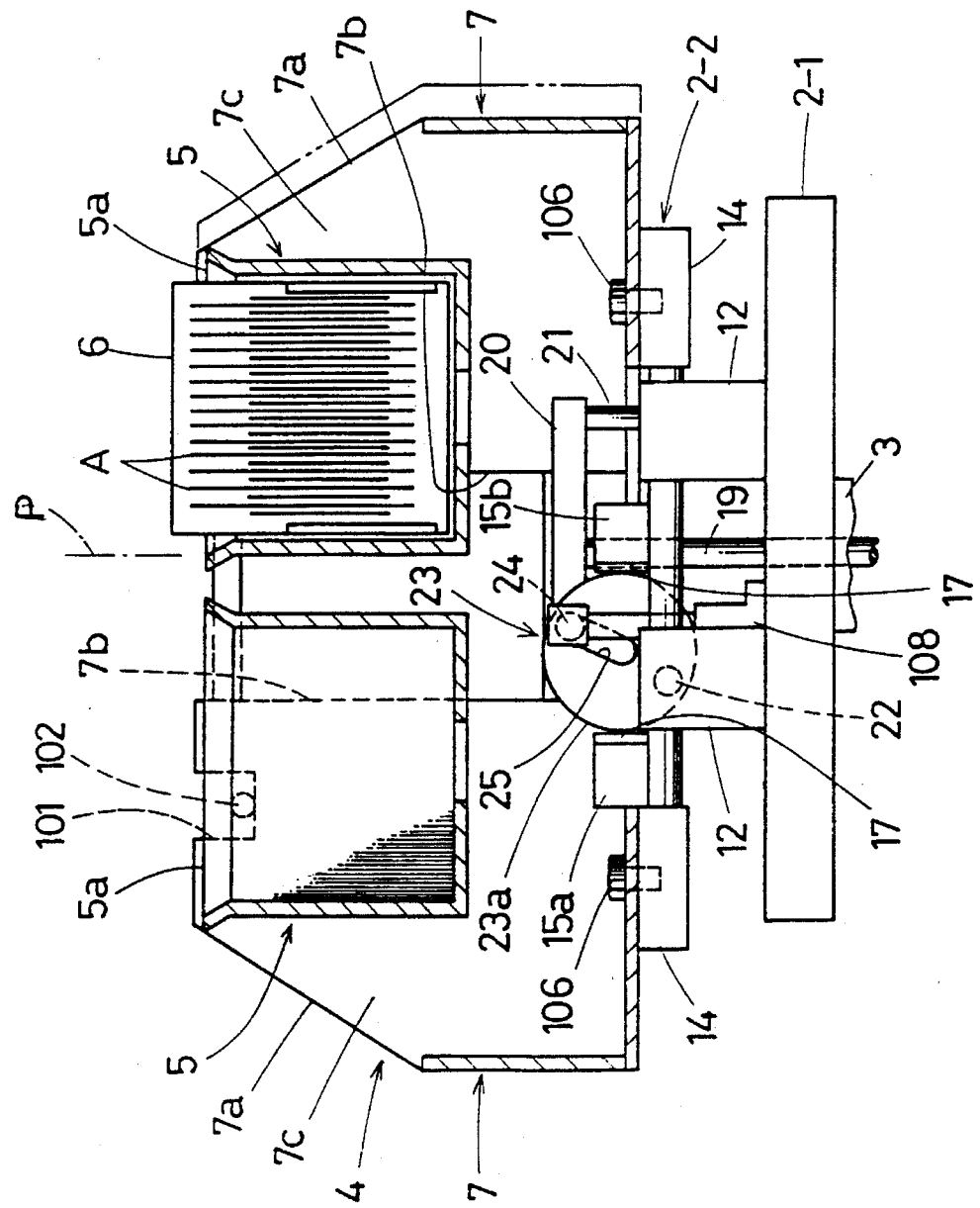
FIG. 6 is a front sectional view showing same essential parts of the draining and drying apparatus, in which the rotor mounting part is in the state of maximum eccentric position by horizontal move in FIG. 4.

For example, as shown in FIGS. 5 and 6, the cassette 6 containing a specific number of semiconductor materials A, A, . . . is put in the right cradle 5 only, while the other left cradle 5 is empty, and when the draining and drying apparatus of the embodiment is used in this state, the holding position (holding form) of the cassette 6 in the conveying device is preliminarily programmed so that the cassette 6 is sequentially conveyed in a series of treating steps comprising etching step, resist peeling step, etc. and related cleaning steps, and is finally put in the right cradle 5 of the draining and drying apparatus in the drying step.

In such programmed case, the operation of the draining and drying apparatus is explained below (see FIGS. 5 and 6).

In the first place, the rotor 4 waits at the position (neutral position) corresponding to the axial center position P of the rotation main shaft 3 in its center as shown in FIG. 5. A specific number of semiconductor materials A, A, . . . are delivered into the right cradle 5 above the rotor 4 in the waiting state, after a series of pretreatment steps as being put in the cassette 6 by the conveying device.

Consequently, the driver means 18 starts to operate, and the vertical shaft 19 is elevated up to the highest position, and the eccentric cam 23 is rotated in the counterclockwise direction. By the rotation of the eccentric cam 23, the rotor mounting part 2-2 moves from the initial neutral position to the left direction horizontally, and the center of rotor 4 is dislocated to a position (maximum eccentric position in FIG. 6) off the maximum limit from the axial center position P of the rotation main shaft 3, and the rotation balance of the rotor 4 to the rotation main shaft 3 is adjusted. In this state, the driving motor 9 rotates to rotate the rotor 4 at high speed through the rotation main shaft 3, thereby drying the semiconductor materials A, A, . . .

After this drying step, the driver means 18 begins to operate again, and the vertical shaft 19 descends to the lowest position, and hence the eccentric cams 23, 23 are rotated in the clockwise direction. By the rotation of the eccentric cam 23, the rotor mounting part 2-2 moves horizontally from the maximum eccentric position in the right direction, and the center of the rotor 4 returns to the neutral position (see FIG. 5) corresponding to the axial center position P of the rotation main shaft 3.

Thereafter, the same operation is repeated, and the specified draining and drying operation is done while adjusting the rotation balance of the rotor 4. At this time, the dislocation of the rotor 4 is adjusted between the neutral position and maximum eccentric position depending on the weight balance of the cradles 5, 5 on the rotor 4. For example, when putting the cassette 6 containing a specific number of semiconductor materials A, A, . . . only in one cradle 5 as in the case above, the rotor 4 is dislocated to the maximum eccentric position in FIG. 6, but when putting the cassette 6 containing a specific number of semiconductor materials A, A, . . . in one cradle and the cassette containing less than a specific number of semiconductor materials A, A, . . . the rotor 4 is dislocated to the right side of the maximum eccentric position.

In this embodiment, meanwhile, the rotor 4 is moved horizontally only in one direction (left direction) from its neutral position (initial position) to adjust the rotation balance, but it may be also constituted to move horizontally in both right and left directions from the neutral position.

The action start timing of the driver means 18 is electrically controlled by the function of conveying device, function of sensors disposed at specified positions, and expiration of preset drying time. Furthermore, the moving distance adjustment of the rotor 4 by the driving part 2-3 in order to adjust the rotation balance of the rotor 4 is electrically controlled by the rotation control of the driver means 18 such as servo motor and pulse motor for moving the vertical shaft 19 up and down vertically, and the function of the sensor disposed to detect the vertical stroke of the vertical shaft 19.

As the driving part 2-3 for horizontally moving the rotor mounting part 2-2, instead of the device constituted as describe above, it may be also possible to using a device in other constitution, for example, a ball screw device.

The case of using the ball screw device is described in detail. A ball nut is affixed to the lower surface of a rotor mounting plate 14 of the rotor mounting part 2-2, and a ball screw to be relatively engaged therewith forward and backward is disposed parallel to the both guide shafts 13, 13 on the rotation base 2-1. On the rotation base 2-1, moreover, a small driver means such as servo motor and pulse motor is disposed, and the drive shaft of this driver means is coupled coaxially with one end of the ball screw. As the driver means drives, the ball screw is rotated normally and reversely, and the rotor mounting part 2-2 which is in one body with the ball screw is moved horizontally.

The draining and drying apparatus of semiconductor materials of the invention is thus composed, and provides the following effects and actions.

When the draining and drying apparatus is used in a state in which the weight balance is not kept between the two cradles on the rotor, for example, the apparatus is used by putting a cassette containing a specific number of semiconductor materials only in one cradle, or by putting a cassette containing a specific number of semiconductor materials in one cradle and a cassette containing less than a specific number of semiconductor materials in the other cradle, the rotor is moved and adjusted in the horizontal direction, so that its rotation balance is adjusted.

Therefore, to adjust the rotation balance of the rotor, it is not necessary to fill with dummy semiconductor materials manually by the operator as required heretofore, and hence lowering of the processing efficiency in the drying process is prevented, while it causes no problem in the flow of a series of treating steps comprising etching step, resist peeling step, etc. and related cleaning steps as pretreatment process.

Moreover, the labor of workers can be saved significantly, so that the fatigue of workers may be alleviated.

As the invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A draining and drying apparatus of semiconductor materials comprising:

rotor means disposed rotatably in a stationary rotor casing for holding semiconductor materials, rotation main shaft means for supporting so as to rotate the rotor means at high speed, and rotor horizontal moving means interposed between the rotation main shaft means and the rotor means so as to move and adjust the horizontal direction position of the rotor means with respect to the rotation main shaft means, wherein said draining and drying apparatus is constituted so as to adjust the rotation balance depending on the holding state of the semiconductor materials.

2. A draining and drying apparatus of semiconductor materials according to claim 1, wherein the rotor means comprises a rotor disposed rotatably in the rotor casing, and a pair of cradles for accommodating and holding so as to put in and take out cassettes containing semiconductor materials disposed on the rotor, and the pair of cradles are disposed oppositely across the center of the rotor.

3. A draining and drying apparatus of semiconductor materials according to claim 2, wherein the pair of cradles are suspended and supported on the rotor so as to be tiltable vertically.

4. A draining and drying apparatus of semiconductor materials according to claim 2, wherein the rotation main shaft means comprises a rotation main shaft disposed in the central part of the bottom of the rotor casing rotatably and in vertical state, and rotation driving means for rotating the rotation main shaft at high speed.

5. A draining and drying apparatus of semiconductor materials according to claim 4, wherein the rotor horizontal moving means comprises a rotation base mounted on the upper end part of the rotation main shaft in horizontal state, a rotor mounting part disposed so as to be movable in the horizontal direction on the rotation base so as to mount and hold the rotor, and a driving part for moving the rotor mounting part horizontally.

6. A draining and drying apparatus of semiconductor materials according to claim 5, wherein the rotor mounting part consists of a pair of guide shafts and a pair of rotor mounting members being formed in a framework defining an approximately rectangular form along a plane, both said guide shafts are parallel to each other, and are supported on the rotation base slidably on the horizontal direction, a rotor comprising the cradles is mounted and fixed on the both rotor mounting members, and the pair of cradles are disposed oppositely across the center of the rotor.

7. A draining and drying apparatus of semiconductor materials according to claim 6, wherein the driving part comprises an eccentric cam disposed so as to be rotatable eccentrically on the rotation base, and cam driving means for driving the eccentric cam, and a cam abutting part of the rotor mounting part is slidably engaged with the cam surface of the eccentric cam, and the rotor mounting part moves in the horizontal direction through the cam abutting part by the eccentric rotation of the eccentric cam by the cam driving means.

8. A draining and drying apparatus of semiconductor materials according to claim 7, wherein the eccentric cam of the driving part and the cooperating cam abutting part are disposed so as to confront each other in both rotor mounting members, and each cam abutting part has a synthetic resin plate of high lubricity disposed on its contact surface.

9. A draining and drying apparatus of semiconductor materials according to claim 6, wherein the driving part consists of a ball nut disposed in the rotor mounting part, a ball screw disposed parallel to the guide shaft on the rotation base so as to be engaged with the ball nut forward and backward relatively, and a driving part for rotating the ball screw, and the rotor mounting part moves in the horizontal direction through the ball nut through rotation of the ball screw by the driving part.

10. A draining and drying apparatus of semiconductor materials in a constitution in which a rotor is disposed in a rotor casing, a pair of cradles are disposed on the rotor oppositely each other across a center of the rotor, and the semiconductor materials contained in these cradles are drained and dried by high speed rotation of the rotor, wherein a rotor horizontal moving mechanism is incorporated in the rotation main shaft, and the rotor is mounted on the rotor horizontal moving mechanism, and the rotor horizontal moving mechanism comprises a rotation base affixed and supported on the upper end of the rotation main shaft, a rotor mounting part disposed on this rotation base so as to be movable horizontally toward the opposite directions of both said cradles, and a driving part for moving the rotor mounting part horizontally.

* * * * *